(12) United States Patent
Cho et al.

(10) Patent No.: US 11,054,462 B2
(45) Date of Patent: Jul. 6, 2021

(54) SEMICONDUCTOR DEVICE AND METHOD OF TESTING THE SAME

(71) Applicant: Samsung Electronics Co., Ltd., Suwon-si (KR)

(72) Inventors: Joon Woo Cho, Seoul (KR); Yun Ju Kwon, Yongin-si (KR); Sang Woo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 599 days.

(21) Appl. No.: 15/791,738

(22) Filed: Oct. 24, 2017

(65) Prior Publication Data

US 2018/0217202 A1 Aug. 2, 2018

(30) Foreign Application Priority Data

Feb. 1, 2017 (KR) ........................ 10-2017-0014217

(51) Int. Cl.
*G01R 31/28* (2006.01)
*G06F 1/3206* (2019.01)
*G06F 1/3209* (2019.01)
*G06F 1/3296* (2019.01)
*G06F 1/26* (2006.01)

(52) U.S. Cl.
CPC .......... *G01R 31/2853* (2013.01); *G06F 1/26* (2013.01); *G06F 1/3206* (2013.01); *G06F 1/3209* (2013.01); *G06F 1/3296* (2013.01); *G01R 31/2884* (2013.01)

(58) Field of Classification Search
CPC ... G01R 31/2853; G01R 31/2884; G06F 1/26; G06F 1/3206; G06F 1/3209; G06F 1/3296

USPC ...................................................... 324/762.01
See application file for complete search history.

(56) References Cited

U.S. PATENT DOCUMENTS

| 7,392,413 | B2 | 6/2008 | Shikata |
| 7,446,559 | B2 | 11/2008 | Alie |
| 7,541,835 | B1* | 6/2009 | Shaikh ..................... G06F 1/26 326/56 |
| 7,577,859 | B2 | 8/2009 | Bilak |
| 7,721,119 | B2 | 5/2010 | Capps, Jr. et al. |
| 9,134,782 | B2 | 9/2015 | Reddy et al. |
| 9,543,837 | B2 | 1/2017 | Song et al. |

(Continued)

FOREIGN PATENT DOCUMENTS

| CN | 101173972 A | 5/2008 |
| CN | 101903783 A | 12/2010 |

(Continued)

OTHER PUBLICATIONS

Office Action dated May 6, 2021 in Chinese Application No. 201810095346.2.

*Primary Examiner* — Melissa J Koval
*Assistant Examiner* — Courtney G McDonnough
(74) *Attorney, Agent, or Firm* — Harness, Dickey & Pierce, P.L.C.

(57) ABSTRACT

A semiconductor device and a method of testing the same are provided. A semiconductor device includes a Design Under Test (DUT), a processing core configured to execute test software to determine an optimum operating voltage of the DUT, and a protection circuit configured to block the transmission of undefined signals generated by the DUT while the processing core executes the test software.

17 Claims, 6 Drawing Sheets

(56) References Cited

U.S. PATENT DOCUMENTS

| | | | | |
|---|---|---|---|---|
| 2005/0184899 A1* | 8/2005 | Witte | ........................ | G06F 3/05 |
| | | | | 341/155 |
| 2008/0100328 A1* | 5/2008 | Dhong | ............... | G01R 31/3004 |
| | | | | 324/750.3 |
| 2012/0271586 A1* | 10/2012 | Wang | ................. | G01R 31/3167 |
| | | | | 702/119 |
| 2015/0253836 A1 | 9/2015 | Mylius et al. | | |

FOREIGN PATENT DOCUMENTS

| | | |
|---|---|---|
| JP | 2005-267538 A | 9/2005 |
| KR | 2016-0023185 A | 3/2016 |

\* cited by examiner

SEMICONDUCTOR DEVICE AND METHOD OF TESTING THE SAME

This application claims priority to Korean Patent Application No. 10-2017-0014217 filed on Feb. 1, 2017 in the Korean Intellectual Property Office, and all the benefits accruing therefrom under 35 U.S.C. § 119, the disclosure of which is incorporated herein by reference in its entirety.

BACKGROUND

1. Field

The present disclosure relates to a semiconductor device and a method of testing the same.

2. Description of the Related Art

A semiconductor device such as a System-on-Chip (SoC) device includes various elements such as a processing core, a memory controller, and the like, and is driven by receiving a power supply voltage from an external source. The power supply voltage provided to the semiconductor device is generally determined to have a predetermined margin because a system failure is likely to occur unless a sufficient power supply voltage that allows—the semiconductor device to operate normally is supplied to the semiconductor device in consideration of various environmental conditions.

However, as the margin of the power supply voltage increases, the amount of power consumed unnecessarily by the semiconductor device may increase, and the amount of heat generated by the semiconductor device may also increase. In order to address this problem, it is necessary to determine the optimum operating voltage of the semiconductor device accurately so that the semiconductor device can operate stably and the margin of the power supply voltage can be minimized.

SUMMARY

Some example embodiments of the present disclosure provide a semiconductor device, which is capable of performing a test for determining an optimum operating voltage that can reduce the power consumption and the heat generation of the semiconductor device while ensuring a normal operation of the semiconductor device, and is also capable of blocking the influence of undefined signals that may be generated during the test.

Some example embodiments of the present disclosure also provide a method of testing a semiconductor device, which is capable of performing a test for determining an optimum operating voltage that can reduce the power consumption and the heat generation of the semiconductor device while ensuring a normal operation of the semiconductor device, and is also capable of blocking the influence of undefined signals that may be generated during the test.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to some example embodiments of the present disclosure, there is provided a semiconductor device including a design under test (DUT); a processing core executing test software, which is for determining an optimum operating voltage of the DUT; and a protection circuit blocking the transmission of undefined signals that are generated by the DUT during the execution of the test software According to other example embodiments of the present disclosure, there is provided a semiconductor device including a DUT, a first protection circuit configured to block a first undefined signal generated by the DUT during a test for determining an optimum operating voltage of the DUT, and a second protection circuit configured to block a second undefined signal that is generated by the DUT during the test.

According to still other example embodiments of the present disclosure, there is provided a method of testing a semiconductor device including executing test software, to determine an optimum operating voltage of a DUT; driving a protection circuit, to block the transmission of undefined signals generated by the DUT during the execution of the test software; performing a first test by applying a first voltage to the DUT; and performing a second test by applying a second voltage, which is higher than the first voltage, to the DUT if the DUT fails the first test.

According to other example embodiments of the present disclosure, there is provided a semiconductor device including a processing core configured to execute test software to determine an optimum operating voltage of a design under test (DUT), and at least one protection circuit configured to block undefined signals generated by the DUT during execution of the test software.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail some example embodiments thereof with reference to the attached drawings, in which.

DETAILED DESCRIPTION

Figure 1:
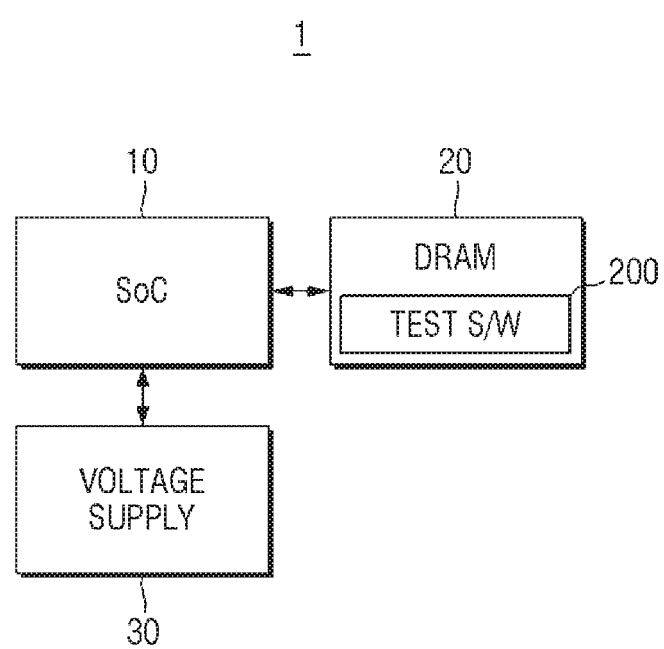
FIG. 1 is a block diagram of a semiconductor system according to some example embodiments of the present disclosure.

FIG. 1 is a block diagram of a semiconductor system according to an example embodiment of the present disclosure.

Referring to FIG. 1, a semiconductor system 1 includes a System-on-Chip (SoC) 10, a Dynamic Random Access Memory (DRAM) 20, and a voltage supply circuit 30.

The SoC 10 is a semiconductor device that implements a system having a plurality of functions as a single chip. In some example embodiments, the SoC 10 may be an application processor used for a mobile device, but the present disclosure is not limited thereto.

The DRAM 20 stores software and data to be executed or processed by the SoC 10. The DRAM 20 is illustrated in FIG. 1, but the present disclosure is not limited thereto. The DRAM 20 may be replaced with another volatile memory device according to the purpose of implementation of the semiconductor system 1. In some example embodiments, the DRAM 20 stores test software 200, which will be described later in connection with the inventive concept of the present disclosure, and the SoC 10 may execute the test software 200.

A voltage supply circuit 30 supplies a voltage to the SoC 10. The SoC 10 uses the voltage supplied by the voltage supply circuit 30 for various purposes. For example, the SoC 10 may use the voltage supplied by the voltage supply circuit 30 as a voltage for operating various circuits implemented in the SoC 10 or as a voltage for providing a test voltage needed to perform a test to find an optimum operating voltage of a design under test (DUT), which will be described later.

Figure 2:
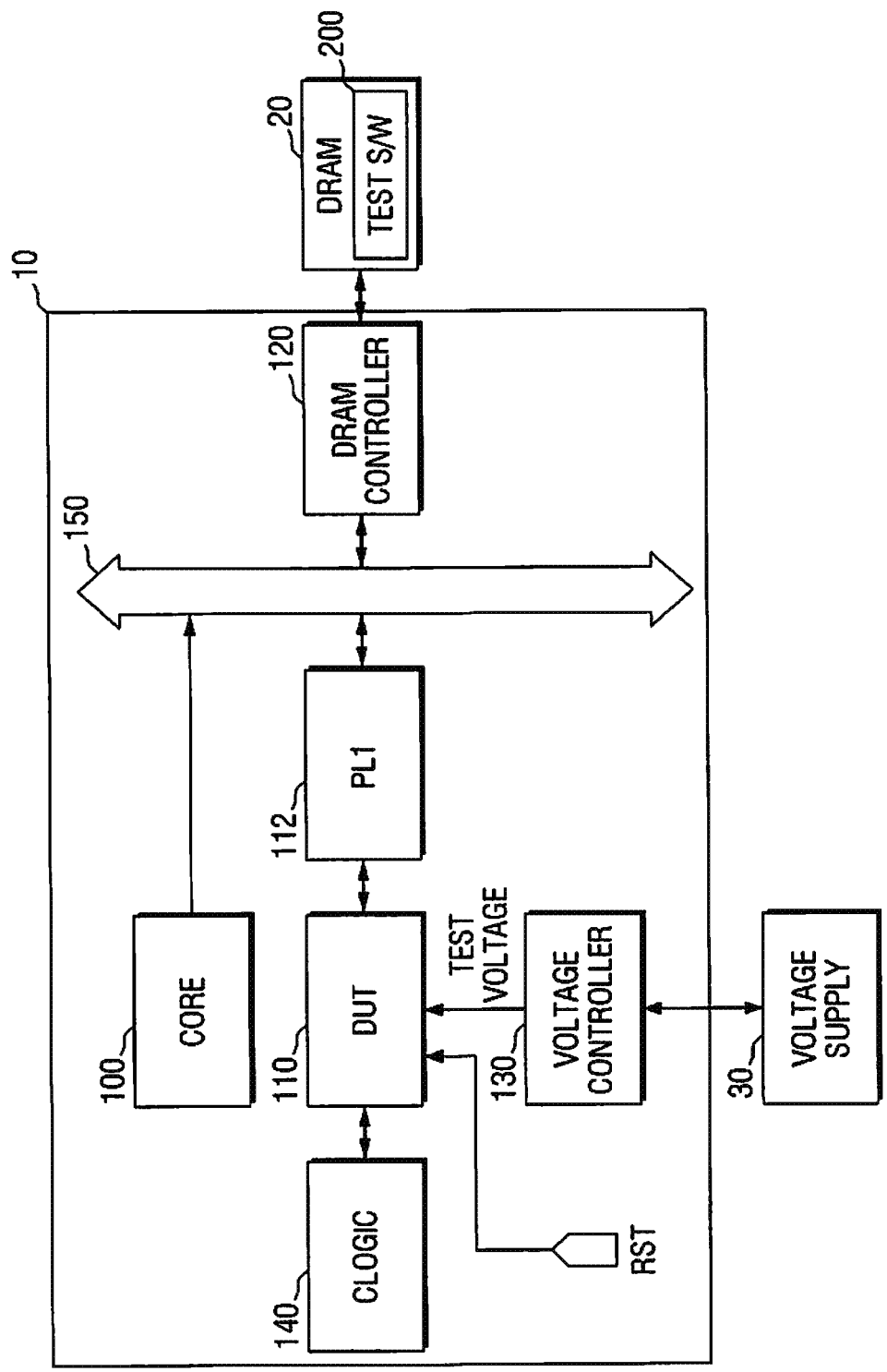
FIG. 2 is a block diagram of a semiconductor system according to other example embodiments of the present disclosure.

FIG. 2 is a block diagram of a semiconductor system according to other example embodiments of the present disclosure.

Referring to FIG. 2, a semiconductor system 2 includes a SoC 10, and the SoC 10 includes a processing core 100, a DUT 110, a protection circuit 112, a DRAM controller 120, a voltage controller 130, and a common logic 140. The processing core 100, the DUT 110, the protection circuit 112, and the DRAM controller 120 may be electrically connected to one another via a bus 150 and may thus transmit data to, or receive data from, one another.

The processing core 100 may control various elements implemented in the SoC 10 and may execute software stored in the DRAM 20. In particular, the processing core 100 may execute test software 200 to determine an optimum operating voltage of the DUT 110, which will be described later. In some example embodiments, the processing core 100 may be implemented as a single core or a multi-core.

The DUT 110 is a circuit element to be tested. The term "test", as used herein, may denote, for example, a test for determining the optimum operating voltage of the DUT 110, but the present disclosure is not limited thereto. That is, the term "test", as used herein, may encompass tests having various other purposes. In some example embodiments, the DUT 110 may be reset by receiving a reset signal RST. The DUT 110 may receive the reset signal RST from another element of the SoC 10 or from an external source through an input/output (I/O) pin of the SoC 10.

The DRAM controller 120 may control the DRAM 20 and may operate as an I/O interface between the SoC 10 and the DRAM 20. For example, the DRAM controller 120 may receive a memory access command from the processing core 100 and may access the DRAM 20 in accordance with the memory access command. The DRAM controller 120 may also provide data received from the DRAM 20 to the processing core 100.

The voltage controller 130 generates a test voltage for driving the DUT 110 using a voltage supplied by a voltage supply circuit 30. The optimum operating voltage of the DUT 110, which can minimize the power consumption and the heat generation of the DUT 110 while ensuring a normal operation of the DUT 110, may be determined using the test voltage, and this will be described later.

The common logic 140 may be any circuit that is electrically connected to the DUT 110 to exchange data or signals. In particular, the common logic 140 is defined to be distinguished from the bus 150. For example, the bus 150 may provide a connection for transferring data according to a predetermined bus protocol, whereas the common logic 140 may provide a connection for transferring data in a manner not particularly limited to a bus protocol.

To determine the optimum operating voltage of the DUT 110, which can minimize the power consumption and the heat generation of the DUT 110 while ensuring a normal operation of the DUT 110, the test software 200 gradually increases the level of the test voltage applied from the voltage controller 130 to the DUT 110. More specifically, the test voltage applied from the voltage controller 130 to the DUT 110 gradually increases from a level that is known as a theoretical minimum level at which the DUT 110 can operate to a sufficient level for enabling an actual normal operation of the DUT 110. The sufficient level for enabling an actual normal operation of the DUT 110 may be a voltage for which a sufficient margin for a normal operation of the DUT 110 is secured in consideration of various environmental factors, conditions, and variables for the operation of the DUT 110.

The test software 200 repeatedly tests the operation of the DUT 110 while applying the test voltage whose level gradually increases to the DUT 110. Then, in response to the sufficient level for enabling an actual operation of the DUT 110 being found, the test software 200 may determine the found voltage as the optimum operating voltage of the DUT 110. A testing method of the test software 200 will be described later with reference to FIG. 6.

During the execution of the test software 200, undefined signals may be generated by the DUT 110. In response to the undefined signals generated by the DUT 110 being transmitted to, for example, the bus 150, other elements of the SoC 10 receiving the undefined signals through the bus 150 may operate unexpectedly, and as a result, the SoC 10 may malfunction or may be damaged.

To prevent this problem, the SoC 10 includes the protection circuit 112. The protection circuit 112 blocks the transmission of the undefined signals from the DUT 110 during the execution of the test software 200. In some example embodiments, the protection circuit 112 may enter an operating state before the test software 200 tests the DUT 110.

In some example embodiments, the protection circuit 112 may notify the test software 200 of the generation of the undefined signals. When notified of the generation of the undefined signals, the test software 200 may stop testing the DUT 110 in a condition where the undefined signals are generated.

More specifically, the protection circuit 112 may block the transmission of an undefined bus signal, among other undefined signals generated by the DUT 110 during the execution of the test software 200, to the bus 150. The undefined bus signal may be a bus signal that is not defined in a bus protocol but affects the operation of the elements connected to the bus 150.

For example, the undefined bus signal may be a bus signal having a bus transaction type not defined in the semiconductor system 2, and the protection circuit 112 may block the transmission of this type of bus signal to the bus 150, thereby preventing the malfunction of the elements connected to the bus 150.

In another example, the undefined bus signal may be a bus signal accessing a memory region yet to be allocated, and the protection circuit 112 may block the transmission of this type of bus signal to the bus 150, thereby preventing the malfunction of the elements connected to the bus 150.

In this example, in particular, the protection circuit 112 may notify the test software 200 of the generation of the undefined bus signal accessing the memory region yet to be allocated. When notified of the generation of the undefined bus signal accessing the memory region yet to be allocated in the DRAM 20, the test software 200 may stop testing the DUT 110 in the condition where the undefined signals are generated, thereby protecting the memory region yet to be allocated in the DRAM 20 and reducing the amount of time spent performing an unnecessary test.

In another example, the protection circuit 112 may clean up bus transactions that are already output on the bus 150, but have not yet received any response.

In the present example embodiment, the protection circuit 112 may be disposed between the DUT 110 and the bus 150 to block the transmission of the undefined bus signal generated by the DUT 110 during the execution of the test software 200, but the arrangement of the protection circuit 112 may vary.

According to the present example embodiment, it is possible to easily determine the optimum operating voltage of the DUT 110, which can minimize the power consumption and the heat generation of the DUT 110 while ensuring a normal operation of the DUT 110. Also, it is possible to block the influence of the undefined bus signal that may be generated during a test for determining the optimal operating voltage of the DUT 110.

Figure 3:
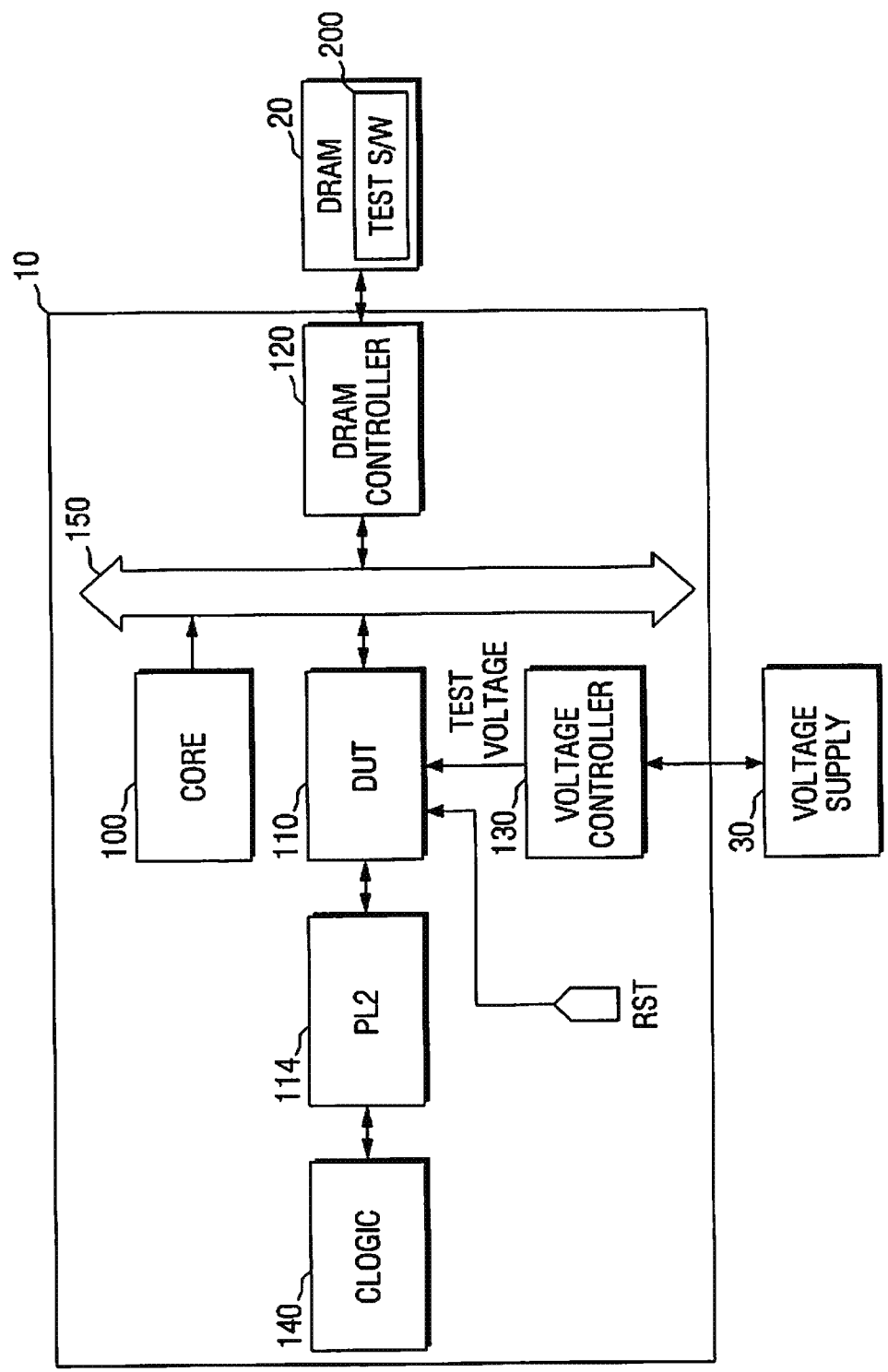
FIG. 3 is a block diagram of a semiconductor system according to other example embodiments of the present disclosure.

FIG. 3 is a block diagram of a semiconductor system according to other example embodiments of the present disclosure.

Referring to FIG. 3, a semiconductor system 3 includes a SoC 10, and the SoC 10 includes a processing core 100, a DUT 110, a protection circuit 114, a DRAM controller 120, a voltage controller 130, and a common logic 140. The processing core 100, the DUT 110, the protection circuit 114, and the DRAM controller 120 may be electrically connected to one another via a bus 150 and may thus transmit data to, or receive data from, one another. The processing core 100, the DUT 110, the DRAM controller 120, the voltage controller 130, and the common logic 140 are as already described above with reference to FIG. 2, and thus, detailed descriptions thereof will be omitted.

To determine an optimum operating voltage of the DUT 110, which can minimize the power consumption and the heat generation of the DUT 110 while ensuring a normal operation of the DUT 110, test software 200 gradually increases the level of a test voltage applied from the voltage controller 130 to the DUT 110. More specifically, the test voltage applied from the voltage controller 130 to the DUT 110 gradually increases from a level that is known as a theoretical minimum level at which the DUT 110 can operate to a sufficient level for enabling an actual normal operation of the DUT 110.

The test software 200 repeatedly tests the operation of the DUT 110 while applying the test voltage whose level gradually increases to the DUT 110. Then, in response to the sufficient level for enabling an actual operation of the DUT 110 being found, the test software 200 may determine the found voltage as the optimum operating voltage of the DUT 110. A testing method of the test software 200 will be described later with reference to FIG. 6.

During the execution of the test software 200, undefined signals may be generated by the DUT 110. In response to the undefined signals generated by the DUT 110 being transmitted to, for example, the common logic 140, elements included in the common logic 140 or other elements of the SoC 10 receiving the undefined signals through the common logic 140 may operate unexpectedly, and as a result, the SoC 10 may malfunction or may be damaged.

To prevent this problem, the SoC 10 includes the protection circuit 114. The protection circuit 114 blocks the transmission of the undefined signals from the DUT 110 during the execution of the test software 200. In some example embodiments, the protection circuit 114 may enter an operating state before the test software 200 tests the DUT 110.

In some example embodiments, the protection circuit 114 may notify the test software 200 of the generation of the undefined signals. When notified of the generation of the undefined signals, the test software 200 may stop testing the DUT 110 in a condition where the undefined signals are generated.

More specifically, the protection circuit 114 may block the transmission of an undefined sideband signal, among other undefined signals generated by the DUT 110 during the execution of the test software 200, to the common logic 140. The undefined sideband signal, which is different from the undefined bus signal described above with reference to FIG. 2, is neither a bus signal nor a signal defined in the semiconductor system 3, but is a signal affecting the operation of the elements of the SoC 10.

For example, the undefined sideband signal may be a signal that is not defined in the semiconductor system 2 but affects the operation of elements connected to the common logic 140, and the protection circuit 112 may block the transmission of this type of undefined sideband signal to the common logic 140, thereby preventing the malfunction of the elements included in, or connected to, the common logic 140.

In the present example embodiment, the protection circuit 114 may be disposed between the DUT 110 and the common logic 140 to block the transmission of the undefined sideband signal generated by the DUT 110 during the execution of the test software 200, but the arrangement of the protection circuit 112 may vary.

The protection circuit 114 may be configured to fix some ports of the DUT 110 to a predetermined or set value. That is, ports used only during a test, for example, ports used in bus transactions, are activated, and other ports, for example, ports outputting sideband signals, are fixed to the predetermined or set value and are thus inactivated. In this manner, the output of the undefined sideband signal from the DUT 110 may be prevented.

According to the present example embodiment, it is possible to easily determine the optimum operating voltage of the DUT 110, which can minimize the power consumption and the heat generation of the DUT 110 while ensuring a normal operation of the DUT 110. Also, it is possible to block the influence of the undefined sideband signal that may be generated during a test for determining the optimal operating voltage of the DUT 110.

Figure 4:
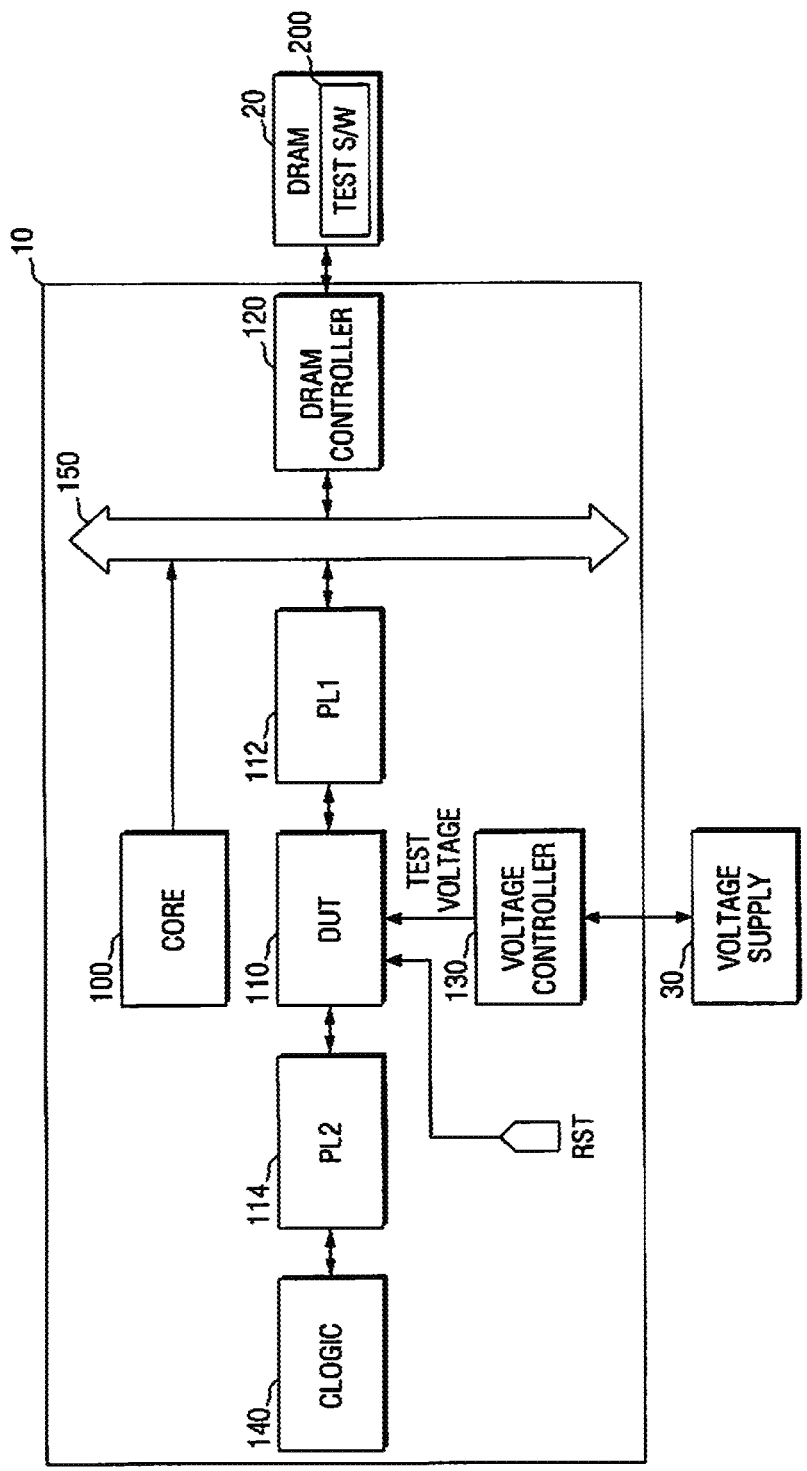
FIG. 4 is a block diagram of a semiconductor system according to other example embodiments of the present disclosure.

FIG. 4 is a block diagram of a semiconductor system according to another example embodiment of the present disclosure.

Referring to FIG. 4, a semiconductor system 4 includes a SoC 10, and the SoC 10 includes a processing core 100, a DUT 110, a first protection circuit 112, a second protection circuit 114, a DRAM controller 120, a voltage controller 130, and a common logic 140. The processing core 100, the DUT 110, the first protection circuit 112, and the DRAM controller 120 may be electrically connected to one another via a bus 150 and may thus transmit data to, or receive data from, one another. The processing core 100, the DUT 110, the DRAM controller 120, the voltage controller 130, and the common logic 140 are as already described above with reference to FIG. 2, and thus, detailed descriptions thereof will be omitted.

During the execution of test software 200, undefined signals may be generated by the DUT 110. Elements of the SoC 10 receiving the undefined signals may operate unexpectedly, and as a result, the SoC 10 may malfunction or may be damaged. To prevent this problem, the SoC 10 includes the first and second protection circuits 112 and 114.

In the present example embodiment, the undefined signals may include first and second undefined signals. The first protection circuit 112 may block the transmission of the first undefined signal, which is generated during a test for determining an optimum operating voltage of the DUT 110, and the second protection circuit 114 may block the transmission of the second undefined signal, which is also generated during the test for determining the optimum operating voltage of the DUT 110.

The first undefined signal may include the undefined bus signal described above with reference to FIG. 2, and the first protection circuit 112 may block the transmission of the undefined bus signal to the bus 150. The second undefined signal may include the undefined sideband signal described above with reference to FIG. 2, and the second protection circuit 114 may block the transmission of the undefined sideband signal to the common logic 140.

In some example embodiments, the first and second protection circuits 112 and 114 may enter an operating state before the test software 200 tests the DUT 110.

In some example embodiments, the first and second protection circuits 112 may notify the test software 200 of the generation of the first and second undefined signals. When notified of the generation of the first and second undefined signals, the test software 200 may stop testing the DUT 110 in a condition where the first and second undefined signals are generated.

In the present example embodiment, the first protection circuit 112 may be disposed between the DUT 110 and the bus 150 to block the transmission of the first undefined signal generated by the DUT 110 during the execution of the test software 200, but the arrangement of the first protection circuit 112 may vary.

In the present example embodiment, the second protection circuit 114 may be disposed between the DUT 110 and the common logic 140 to block the transmission of the second undefined signal generated by the DUT 110 during the execution of the test software 200, but the arrangement of the second protection circuit 114 may vary.

According to the present example embodiment, it is possible to easily determine the optimum operating voltage of the DUT 110, which can minimize the power consumption and the heat generation of the DUT 110 while ensuring a normal operation of the DUT 110. Also, it is possible to block the influence of undefined signals that may be generated during the test for determining the optimal operating voltage of the DUT 110.

Figure 5:
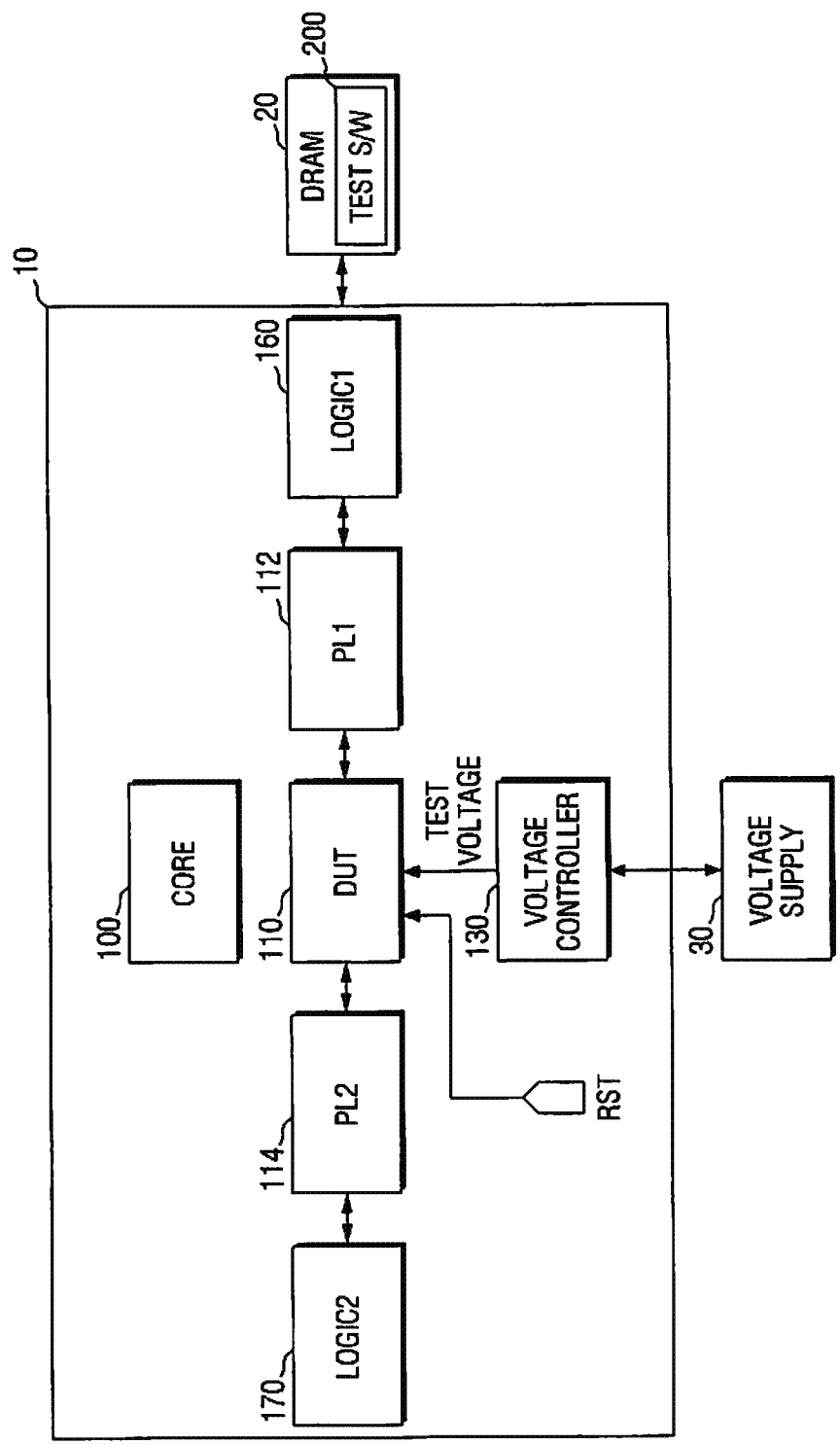
FIG. 5 is a block diagram of a semiconductor system according to other example embodiments of the present disclosure.

FIG. 5 is a block diagram of a semiconductor system according to other example embodiments of the present disclosure.

Referring to FIG. 5, a semiconductor system 5 includes a SoC 10, and the SoC 10 includes a processing core 100, a DUT 110, a first protection circuit 112, a second protection circuit 114, a voltage controller 130, a first region 160, and a second region 170. The processing core 100, the DUT 110, and the voltage controller 130 are as already described above with reference to FIG. 2, and thus, detailed descriptions thereof will be omitted.

During the execution of test software 200, undefined signals may be generated by the DUT 110. Elements of the SoC 10 receiving the undefined signals may operate unexpectedly, and as a result, the SoC 10 may malfunction or may be damaged. To prevent this problem, the SoC 10 includes the first and second protection circuits 112 and 114.

In the present example embodiment, the undefined signals may include first and second undefined signals. The first protection circuit 112 may block the transmission of the first undefined signal, which is generated during a test for determining an optimum operating voltage of the DUT 110, to the first region 110, and the second protection circuit 114 may block the transmission of the second undefined signal, which is also generated during the test for determining the optimum operating voltage of the DUT 110, to the second region 170.

The first undefined signal may include the undefined bus signal described above with reference to FIG. 2, and the first region 160 may include, but is not limited to, the bus 150 of FIG. 2. Alternatively, the first region 160 may include an arbitrary circuit.

The second undefined signal may include the undefined sideband signal described above with reference to FIG. 2, and the second region 170 may include, but is not limited to, the common logic 140 of FIG. 3. Alternatively, the second region 170 may include an arbitrary circuit.

In some example embodiments, the first and second protection circuits 112 and 114 may enter an operating state before the test software 200 tests the DUT 110.

In some example embodiments, the first and second protection circuits 112 may notify the test software 200 of the generation of the first and second undefined signals. When notified of the generation of the first and second undefined signals, the test software 200 may stop testing the DUT 110 in a condition where the first and second undefined signals are generated.

In some example embodiments, the first protection circuit 112 may be disposed between the DUT 110 and the first region 160 to block the transmission of the first undefined signal generated by the DUT 110 during the execution of the test software 200, but the arrangement of the first protection circuit 112 may vary.

In some example embodiments, the second protection circuit 114 may be disposed between the DUT 110 and the second region 170 to block the transmission of the second undefined signal generated by the DUT 110 during the execution of the test software 200, but the arrangement of the second protection circuit 114 may vary.

According to the present example embodiment, it is possible to easily determine the optimum operating voltage of the DUT 110, which can minimize the power consumption and the heat generation of the DUT 110 while ensuring a normal operation of the DUT 110. Also, it is possible to block the influence of undefined signals that may be generated during the test for determining the optimal operating voltage of the DUT 110.

Figure 6:
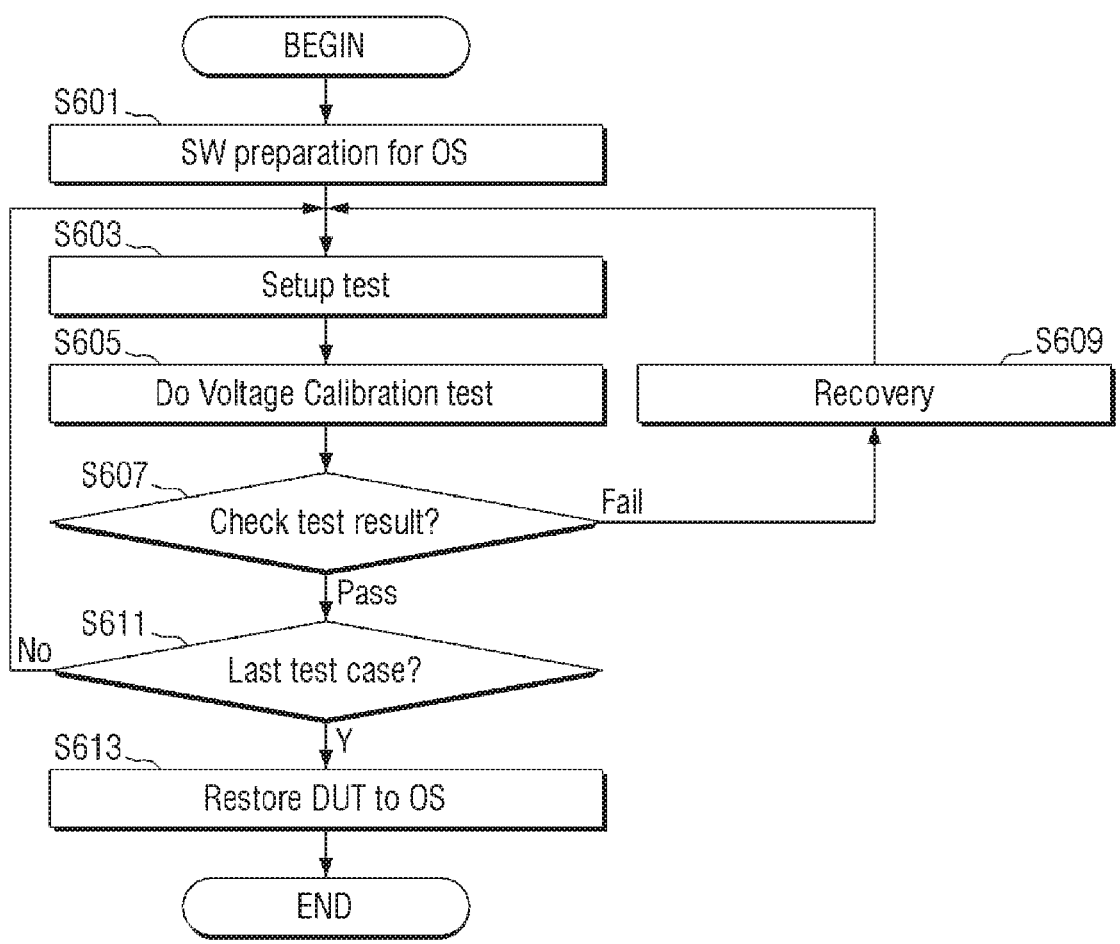
FIG. 6 is a flowchart illustrating a method of testing a semiconductor device according to some example embodiments of the present disclosure.

FIG. 6 is a flowchart illustrating a method of testing a semiconductor device according to some example embodiments of the present disclosure.

Referring to FIG. 6, the test software 200, which is for determining the optimum operating voltage of the DUT 110, is prepared and executed (S601).

Thereafter, a test for determining the optimum operating voltage of the DUT 110 is set (S602). In S602, the first and second protection circuits 112 and 114, which block the transmission of undefined signals that may be generated by the DUT 110 during the execution of the test software 200, may be driven.

For example, the first protection circuit 112 may block the transmission of an undefined bus signal, among other undefined signals generated by the DUT 110, to the bus 150.

For example, the second protection circuit 114 may block the transmission of an undefined sideband signal, among other undefined signals generated by the DUT 110, to the common logic 140.

After the operation of the first and second protection circuits 112 and 114 begins, a voltage calibration test is performed (S605) by applying a test voltage to the DUT 110. For example, a first test is performed by applying a first voltage to the DUT 110.

The result of the first test is checked (S607). If the result of the first test shows that the DUT 110 has failed the first test, the DUT 110 is reset and restored (S609) using the rest signal RST of FIG. 2. Once the DUT 110 is restored, the method returns to S603 so that another test, for example, a second test, can be performed.

In some example embodiments, the DUT 110 may receive the reset signal RST from another element of the SoC 10 or from an external source via the I/O pin of the SoC 10.

That is, in S605, the second test may be performed by applying a second voltage, which is higher than the first voltage, to the DUT 110.

The result of the second test is checked (S607). If the result of the second test shows that the DUT 110 has failed the second test, the DUT 110 is reset and restored again using the rest signal RST, and another test is performed.

If the result of the first test shows that the DUT 110 has passed the first test, the first voltage is determined as the optimum operating voltage of the DUT 110 (S613). If the DUT 110 has failed the first test, but has passed the second test, the second voltage is determined as the optimum operating voltage of the DUT 110 (S613).

Thereafter, the test of the DUT 110 is completed, and control rights are transferred to an Operating System (OS) (S613).

According to the present example embodiment, it is possible to easily determine the optimum operating voltage of the DUT 110, which can minimize the power consumption and the heat generation of the DUT 110 while ensuring a normal operation of the DUT 110. Also, it is possible to block the influence of undefined signals that may be generated during the test for determining the optimal operating voltage of the DUT 110.

Although some example embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A semiconductor device, comprising:
 a bus configured to transfer signals according to a bus protocol;
 a design under test (DUT) electrically connected to the bus;
 a processing core electrically connected to the bus and configured to execute test software to determine an operating voltage of the DUT; and
 a protection circuit configured to (1) block undefined signals generated by the DUT from being transmitted to the bus while the processing core executes the test software or configured to (2) block transmission of sideband signals generated by the DUT while the processing core executes the test software,
 wherein the undefined signals are not defined by the bus protocol, and
 wherein the protection circuit is configured to notify the processing core of the generation of the undefined signals or the sideband signals.

2. The semiconductor device of claim 1, wherein the protection circuit is electrically connected between the DUT and the bus.

3. The semiconductor device of claim 1, wherein
 the DUT is electrically connected to a common logic, and
 the protection circuit is configured to block transmission of the sideband signals to the common logic while the processing core executes the test software.

4. The semiconductor device of claim 3, wherein the protection circuit is electrically connected between the DUT and the common logic.

5. The semiconductor device of claim 3, wherein the protection circuit is configured to block the transmission of the sideband signals to the common logic by fixing some ports of the DUT to a set value.

6. The semiconductor device of claim 1, wherein the protection circuit is configured to enter an operating state before the processing core executes the test software to test the DUT.

7. The semiconductor device claim 1, wherein the test software includes instructions to stop testing the DUT in response to the processing core being notified of the generation of the undefined signals or the sideband signals.

8. The semiconductor device of claim 1, further comprising:
 a voltage controller configured to provide a test voltage to the DUT.

9. A semiconductor device, comprising:
 a design under test (DUT);
 a bus electrically connected to the DUT, the bus configured to transfer signals according to a bus protocol;
 a first protection circuit configured to block a first undefined signal generated by the DUT from being transmitted to the bus during a test for determining an operating voltage of the DUT, the first undefined signal being a signal not defined by the bus protocol; and
 a second protection circuit configured to block a second undefined signal generated by the DUT during the test, the second undefined signal being a sideband signal.

10. The semiconductor device of claim 9, wherein
 the first protection circuit is configured to block transmission of the first undefined signal to a first region of the semiconductor device.

11. The semiconductor device of claim 10, wherein
 the first region includes the bus, and
 the first protection circuit is electrically connected between the DUT and the bus.

12. The semiconductor device of claim 9, wherein
 the second protection circuit is configured to block transmission of the sideband signal to a second region of the semiconductor device.

13. The semiconductor device of claim 12, wherein
 the second region includes a common logic, and
 the second protection circuit is electrically connected between the DUT and the common logic.

14. The semiconductor device of claim 13, wherein the second protection circuit is configured to block the transmission of the sideband signal to the common logic by fixing some ports of the DUT to a set value.

15. The semiconductor device of claim 9, wherein the first and second protection circuits are configured to enter an operating state before the test begins.

16. A semiconductor device, comprising:
- a processing core configured to execute test software to determine an operating voltage of a design under test (DUT);
- a bus electrically connected to the DUT and the processing core, the bus configured to transfer signals according to a bus protocol;
- a common logic configured to exchange data or signals with the DUT; and
  - at least one protection circuit configured to (1) block undefined signals generated by the DUT from being transmitted to the bus during execution of the test software or (2) block sideband signals generated by the DUT during execution of the test software, and the undefined signals not defined by the bus protocol,
- wherein the at least one protection circuit includes a second protection circuit configured to block the sideband signals generated by the DUT from reaching the common logic.

17. The semiconductor device of claim 16, wherein
- the processing core is configured to communicate with the DUT via the bus, and
- the at least one protection circuit includes a first protection circuit configured to block the undefined signals generated by the DUT from reaching the bus.

* * * * *